United States Patent [19]

DeLarge

[11] Patent Number: 5,082,547
[45] Date of Patent: Jan. 21, 1992

[54] PLASMA ETCHING REACTOR

[75] Inventor: Gregory W. DeLarge, Garden Grove, Calif.

[73] Assignee: Plasma Etch, Huntington Beach, Calif.

[21] Appl. No.: 649,079

[22] Filed: Feb. 1, 1991

[51] Int. Cl.$^5$ .................. H01H 1/46; C23F 4/04; B01J 19/12
[52] U.S. Cl. .................. 204/298.39; 156/345
[58] Field of Search ............ 204/298.39; 156/345

[56] References Cited

U.S. PATENT DOCUMENTS

| | | | |
|---|---|---|---|
| 4,399,014 | 8/1983 | Engle | 204/192 |
| 4,496,420 | 1/1985 | Frohlich et al. | 156/643 |
| 4,676,865 | 6/1987 | DeLarge | 156/643 |

FOREIGN PATENT DOCUMENTS 63-119225   5/1988   Japan ..................... 156/643

*Primary Examiner*—Aaron Weisstuch
*Attorney, Agent, or Firm*—Edgar W. Averill, Jr.

[57] ABSTRACT

An improved plasma etching reactor of the type which has a vacuum chamber and which includes an electrostatic shield. The chamber has inner wall surfaces which are covered with a dielectric layer such as Teflon which in turn is covered on the inwardly facing surface thereof with a conductive layer such as aluminum. This provides a more uniform plasma reaction. The chamber is of the type which has alternating charged and ground electrodes.

7 Claims, 1 Drawing Sheet

PLASMA ETCHING REACTOR

BACKGROUND OF THE DISCLOSURE

The field of the invention is plasma reactors. Such reactors are commonly used in the desmear/etchback process for printed wiring board fabrication, and they are also used for other etching, cleaning and surface modification uses. One such reactor is shown in U.S. Pat. No. 4,676,865 which utilizes a reactor with heated plates.

The plasma reaction should be controlled so that it provides a uniform action on the entire part being treated.

Prior art designs use either no electrostatic shielding or attempt to strategically locate electrostatic shielding in the zone between the vacuum chamber walls and the plasma electrodes. In the case where no electrostatic shielding is used, major plasma reactions occur between the plasma electrodes and the vacuum chamber walls. This results in plasma etching nonuniformity, and plasma etching speed is severely restricted. When strategically located electrostatic shields are used, only partial improvement results with plasma reaction still occurring in areas not covered by shielding. Additionally, a plasma reaction occurs behind the shielding (that is between the vacuum chamber wall and the shield) because such shielding is not placed in intimate contact with the vacuum chamber walls.

SUMMARY OF THE INVENTION

It is an object of the present invention to provide an improved plasma etching reactor which results in improved uniformity of the plasma reaction.

The present invention is for an improved plasma etching reactor of the type which has a vacuum chamber with chamber walls having inner surfaces and further including a plurality of conductive plates. The improvement comprises electrostatic shield means essentially completely covering and in intimate contact with the inner surfaces of the chamber walls. The electrostatic shield means comprises a dielectric layer adjacent the chamber walls and a conductive layer adjacent the inwardly facing surface of the dielectric layer.

DESCRIPTION OF THE PREFERRED EMBODIMENTS

Figure 1:
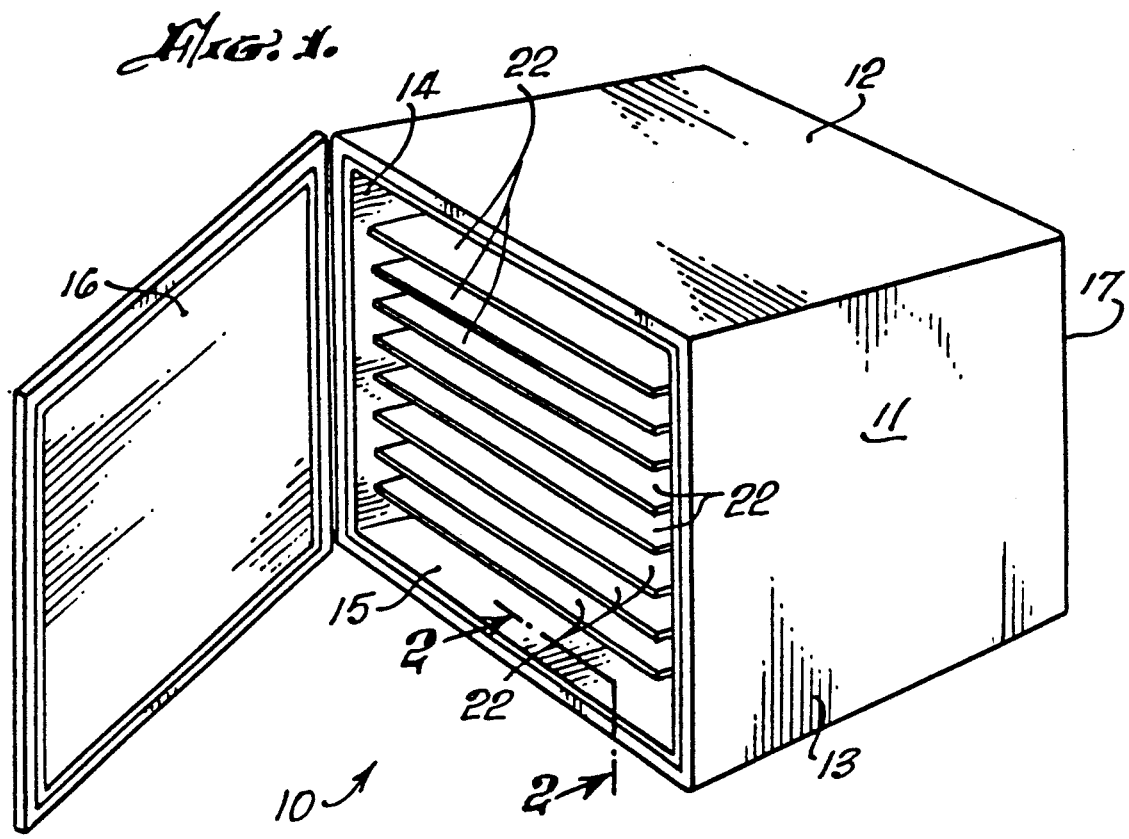
FIG. 1 is a perspective view of the improved plasma etching reactor of the present invention.
Figure 2:
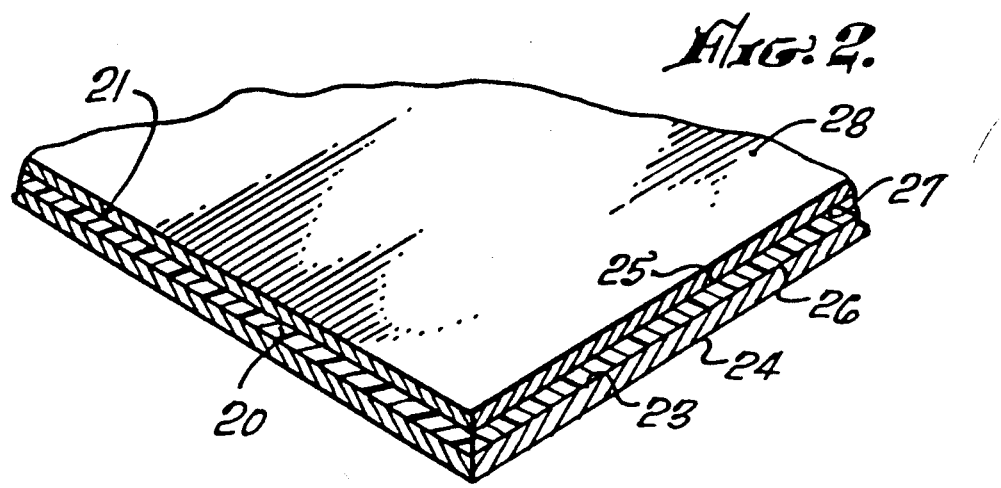
FIG. 2 is an enlarged cross-sectional view taken along line 2—2 of FIG. 1.

The improved plasma etching reactor of the present invention is shown in FIG. 1 and indicated by reference character 10. Reactor 10 has a vacuum chamber 11 which has a top 12, sides 13 and 14, a bottom 15, a door 16 and a back 17 (not shown). These six elements provide the six internal surfaces, and all of these surfaces are covered with an electrostatic shield which is shown in cross-sectional view in FIG. 2. There the chamber wall or bottom 15 is in intimate contact with a dielectric layer 20. A conductive layer 21 is in intimate contact with dielectric layer 20, but electrically insulated from the chamber wall 15. It is to be understood that all six chamber walls 12 through 17 are covered with the shield shown in cross-sectional view in FIG. 2.

The dielectric layer may be any nonconductive material which has sufficient strength, heat resistance, and resistance to the vacuum and plasma atmospheres. The polytetrafluoroethane polymer sold under the trademark "Teflon" has been found to be a useable material as would a ceramic layer. The conductive layer is preferably made from aluminum in view of its excellent conductivity, lightweight and relative low cost.

The chamber has a plurality of conventional electrodes 22, and these electrodes 22 are preferably heated in the manner described in U.S. Pat. No. 4,676,865. The electrodes 22 are of two different types. One is a charged electrode and the other is a ground electrode. The parts to be etched are to be placed on the upper surface of all electrodes except for the uppermost electrode, and the plasma is maintained in a conventional manner between the charged electrodes and the ground electrodes. The vacuum chamber 11 is of the type which is evacuated followed by the introduction of a conventional gas well known to those skilled in the arts such as a mixture of tetrafluoro methane and oxygen.

The dielectric layer is preferably mechanically affixed to the inner surfaces of the chamber walls. The inner surface of chamber wall 15 is indicated by reference character 23 in FIG. 2, and the outer surface by reference character 24. The dielectric layer 20 has an inwardly facing surface 25 and an outwardly facing surface 26 which is in contact with the inner surface of chamber wall 15. Lastly, the aluminum, or conductive layer 21 has an outwardly facing surface 27 which is in contact with the inwardly facing surface 25 of the dielectric layer 20, and the conductive layer 21 has an inwardly facing surface 28. One method of joining the dielectric shield to the vacuum chamber wall is by using aluminum screws which pass through the conductive layer 21 and into the chamber wall 15. The aluminum screws are, of course, electrically insulated from the conductive layer 21 so that it can provide its appropriate shielding function.

The present embodiments of this invention are thus to be considered in all respects as illustrative and not restrictive; the scope of the invention being indicated by the appended claims rather than by the foregoing description. Al 1 changes which come within the meaning and range of equivalency of the claims are intended to be embraced therein.

What is claimed is:

1. A plasma etching reactor chamber comprising:
   a vacuum chamber including chamber walls with inner surfaces and a door which, when closed, forms an airtight chamber;
   a plurality of conductive electrode plates positioned in a parallel manner within said chamber, said plates alternating being charged plates and ground plates; and
   shield means on essentially all of the inner surfaces of said chamber walls, said shield means comprising a dielectric layer having an inwardly facing surface and an outwardly facing surface adjacent said inner surfaces of said chamber walls and a conductive layer affixed adjacent said inwardly facing surface of said dielectric layer.

2. The plasma etching reactor chamber of claim 1 wherein said conductive layer is an aluminum layer.

3. The plasma etching reactor chamber of claim 1 wherein said dielectric layer is a polytetrafluoroethane layer.

4. The plasma etching reactor chamber of claim 1 wherein said conductive layer and said dielectric layer are fixed in intimate contact with said walls by insulated screws.

5. The plasma etching reactor chamber of claim 1 wherein said conductive electrode plates are adapted to be externally heated.

6. An improved plasma etching reactor of the type which has a vacuum chamber with chamber walls having inner surfaces, said chamber further including a plurality of conductive plates wherein the improvement comprises:

electrostatic shield means essentially completely covering and in intimate contact with the inner surfaces of the chamber walls, said electrostatic shield means comprising a dielectric layer adjacent the chamber walls and a conductive layer adjacent the inwardly facing surface of the dielectric layer.

7. The improved plasma chamber of claim 6 wherein said conducrive layer is aluminum.